(12) United States Patent
Grodzki

(10) Patent No.: US 9,733,330 B2
(45) Date of Patent: Aug. 15, 2017

(54) METHOD AND MAGNETIC RESONANCE APPARATUS TO OPTIMIZE A MAGNETIC RESONANCE DATA ACQUISITION SEQUENCE

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 459 days.

(21) Appl. No.: 14/487,338

(22) Filed: Sep. 16, 2014

(65) Prior Publication Data

US 2015/0077109 A1    Mar. 19, 2015

(30) Foreign Application Priority Data

Sep. 16, 2013  (DE) .................. 10 2013 218 475

(51) Int. Cl.
*G01R 33/565* (2006.01)
*G01R 33/385* (2006.01)
(Continued)

(52) U.S. Cl.
CPC ....... *G01R 33/565* (2013.01); *G01R 33/3854* (2013.01); *G01R 33/543* (2013.01); *G01R 33/56* (2013.01); *G01R 33/5617* (2013.01)

(58) Field of Classification Search
CPC ............. G01R 33/565; G01R 33/3854; G01R 33/543; G01R 33/56; G01R 33/5617
See application file for complete search history.

(56) References Cited

U.S. PATENT DOCUMENTS 5,481,192 A * 1/1996 Mehlkopf .......... G01R 33/3854
324/318
6,452,391 B1    9/2002 Bernstein et al.
(Continued)

FOREIGN PATENT DOCUMENTS

DE     10 2012 219 016 B3    3/2014

OTHER PUBLICATIONS

De Zwart et al., "Reduction of Gradient Acoustic Noise in MRI USing Sense-EPI," NeuroImage, vol. 16 (2002), pp. 1151-1155.
(Continued)

*Primary Examiner* — Rodney Bonnette
(74) *Attorney, Agent, or Firm* — Schiff Hardin LLP

(57) ABSTRACT

In a method to optimize a magnetic resonance sequence of a magnetic resonance apparatus, the magnetic resonance sequence includes first imaging parameters that, during acquisition of magnetic resonance images by the magnetic resonance sequence, the first imaging parameters produce acoustic noise with a first acoustic noise volume level and magnetic resonance images with image noise at a first signal-to-image noise ratio. An automatic optimization of the imaging parameters is implemented such that during acquisition of magnetic resonance images by the magnetic resonance sequence, the optimized imaging parameters produce acoustic noise with a second acoustic noise volume level and magnetic resonance images with image noise at a second signal-to-image noise ratio. The second acoustic noise volume is reduced by at least 3 dB relative to the first acoustic noise volume and the second signal-to-image noise ratio is reduced by a maximum of 35 percent relative to the first signal-to-image noise ratio.

15 Claims, 2 Drawing Sheets

(51) Int. Cl.
*G01R 33/54* (2006.01)
*G01R 33/56* (2006.01)
*G01R 33/561* (2006.01)

(56) References Cited

U.S. PATENT DOCUMENTS

| | | | |
|---|---|---|---|
| 6,456,074 B1* | 9/2002 | Minas | G01R 33/3854 324/309 |
| 2001/0010464 A1* | 8/2001 | Takamori | G01R 33/3854 324/304 |
| 2007/0159169 A1* | 7/2007 | Sellers | G01R 33/3854 324/318 |
| 2013/0200893 A1 | 8/2013 | Heismann et al. | |
| 2014/0111200 A1 | 4/2014 | Grodzki et al. | |
| 2014/0225616 A1* | 8/2014 | Maciejewski | G01R 33/34 324/318 |
| 2014/0232396 A1 | 8/2014 | Grodzki et al. | |
| 2015/0042333 A1* | 2/2015 | Grodzki | G01R 33/543 324/309 |

OTHER PUBLICATIONS

Hennel et al., "Fast Spin Echo and Fast Gradient Echo MRI With Low Acoustic Noise," Journal of MAgnetic Resonance Imaging, vol. 13 (2001), pp. 960-966.

Latta et al., "Single point imaging with suppressed sound pressure levels through gradient-shape adjustment," Journal of MAgnetic Resonance, vol. 170 (2004), pp. 177-183.

\* cited by examiner

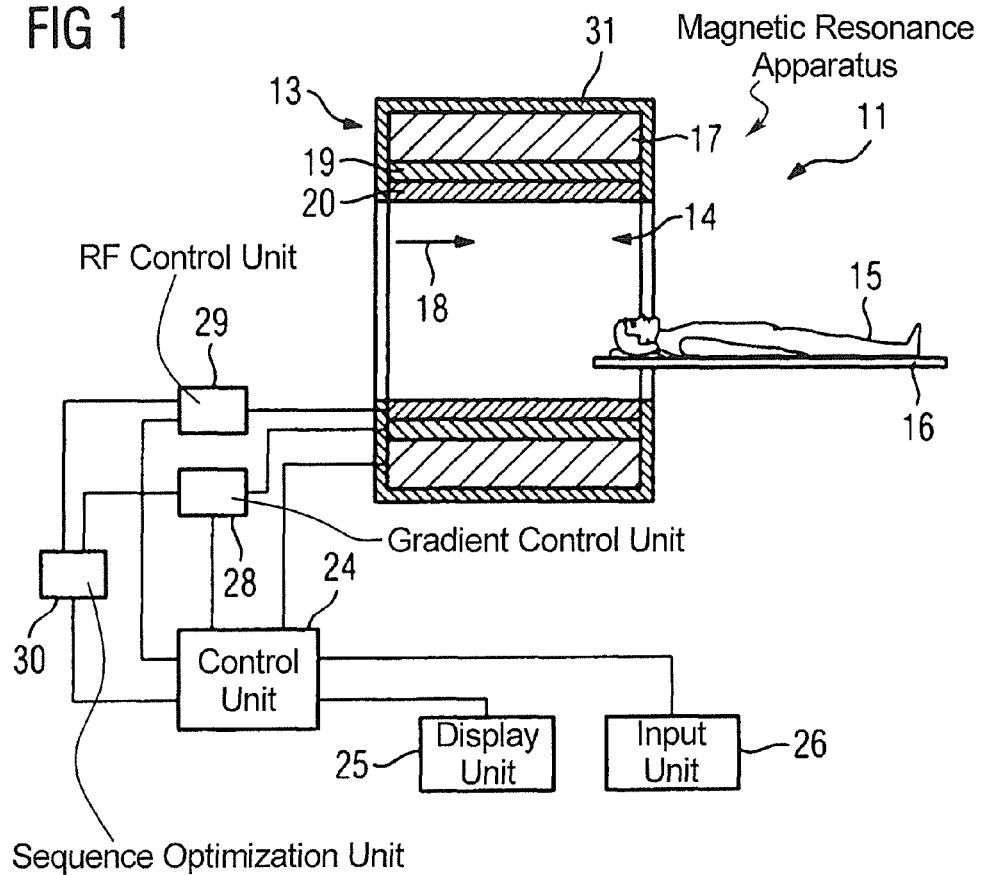
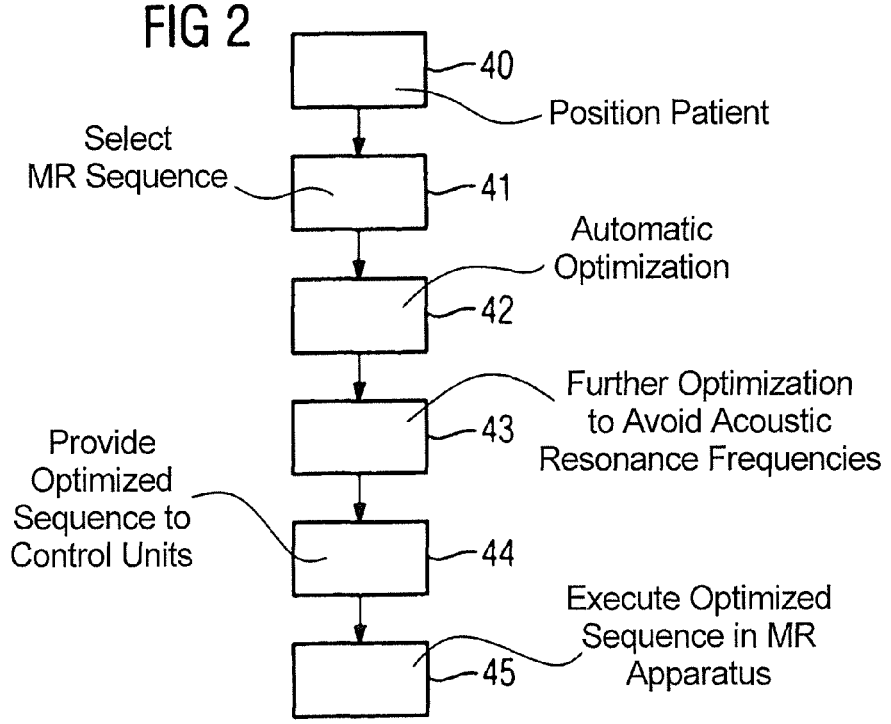

METHOD AND MAGNETIC RESONANCE APPARATUS TO OPTIMIZE A MAGNETIC RESONANCE DATA ACQUISITION SEQUENCE

BACKGROUND OF THE INVENTION

Field of the Invention

The invention concerns a method to optimize a magnetic resonance sequence for operating a magnetic resonance apparatus, as well as a sequence optimization unit for generating such an optimized magnetic resonance sequence according to such a method, a magnetic resonance apparatus embodying such a sequence optimization unit, and a non-transitory, computer-readable data storage medium encoded with programming instructions that, when executed by a computer in which the storage medium is loaded, cause such a method to be implemented.

Description of the Prior Art

The acquisition of magnetic resonance image data by operation of a magnetic resonance apparatus is controlled by magnetic resonance sequences. The magnetic resonance sequences include control commands that, for example, establish the gradient switchings (activations) of the magnetic resonance apparatus and the emission (radiation) of radio-frequency pulses by means of the magnetic resonance apparatus during the acquisition of the magnetic resonance image data. In particular, the gradient switchings established by the magnetic resonance sequence can lead to a high noise level in the magnetic resonance apparatus during the acquisition of the magnetic resonance images.

SUMMARY OF THE INVENTION

The invention is based on the object to enable an advantageous, automatic optimization of imaging parameters of a magnetic resonance sequence in order to reduce the noise level.

In a method to optimize a magnetic resonance sequence of a magnetic resonance apparatus in accordance with the invention, the magnetic resonance sequence includes first imaging parameters, that during an acquisition of magnetic resonance image data the magnetic resonance sequence, produce noise at a first acoustic noise volume level and produce magnetic resonance data with image noise at a first signal-to-image noise ratio, and wherein an automatic optimization of the imaging parameters is implemented that, during the acquisition of magnetic resonance data by the magnetic resonance sequence, produce acoustic noise at an acoustic second noise volume level and magnetic resonance data with an image noise second signal-to-image noise ratio, and wherein the second acoustic noise volume is reduced by at least 3 dB relative to the first acoustic noise volume, and a value of the second signal-to-image noise ratio is reduced by a maximum of 35 percent relative to a value of the first signal-to-image noise ratio.

If not otherwise specified, the term "noise volume" herein means the acoustic noise volume, and "signal-to-noise ratio means the signal to image noise ratio.

Imaging parameters are typically settings of the magnetic resonance sequence, for example settings for gradient switchings or radio-frequency pulses of the magnetic resonance sequence. Control commands of the magnetic resonance sequence are typically generated or adapted using the imaging parameters. Magnetic resonance sequences that have already been pre-produced and that include first imaging parameters matched to one another are typically stored in a database of the magnetic resonance apparatus. An acquisition of magnetic resonance images is already possible by operating the apparatus with the magnetic resonance sequences with the first imaging parameters.

If a reduction of the acoustic noise volume of the magnetic resonance apparatus during the acquisition of magnetic resonance images by the magnetic resonance sequence is desired, a user must typically manually adapt the first imaging parameters of the magnetic resonance sequence. For the user, that is typically difficult since it is usually the case that the user lacks the comprehension or the experience to implement an advantageous adaptation of the first imaging parameters of the magnetic resonance sequence. Due to incorrect modifications of the first imaging parameters of the magnetic resonance sequence by the user, the magnetic resonance sequence adapted by the user may produce images that have an undesirable poorer image quality, or even an increased noise volume.

According to the invention, first imaging parameters of the magnetic resonance sequence are optimized such that a reduction of the acoustic noise volume of the magnetic resonance apparatus during the acquisition of magnetic resonance images is achieved by the optimized magnetic resonance sequence, and at the same time the image quality of the images acquired by the optimized magnetic resonance sequence is largely maintained.

The signal-to-image noise ratio typically represents one measure of the image quality. The value of the signal-to-image noise ratio is typically defined as the ratio of the mean power of a useful signal to the mean noise power of an interference signal. One measure of the acoustic noise volume is typically provided by a noise pressure level. This is measured in decibel (dB) units. Alternatively, the noise pressure level can be adapted to the auditory perception of a person. The noise pressure level is then typically called the assessed noise pressure level and is indicated in decibel-A (dBA) units.

The second noise volume is reduced by at least 5 dB relative to the first noise volume in accordance with the invention. The second noise volume is preferably reduced by at least 10 dB relative to the first noise volume. The second noise volume is most preferably reduced by at least 15 dB relative to the first noise volume. The value of the second signal-to-noise ratio is reduced by at most 25 percent relative to the value of the first signal-to-noise ratio. The value of the second signal-to-noise ratio is preferably reduced by at most 15 percent relative to the value of the first signal-to-noise ratio. Most preferably, the value of the second signal-to-noise ratio is advantageously reduced by at most 5 percent relative to the value of the first signal-to-noise ratio. An increased reduction of the second noise volume relative to the first noise volume can allow an increased reduction of the value of the second signal-to-noise ratio relative to the value of the first signal-to-noise ratio. Any indicated level of the reduction of the noise volume thus can be combined with any indicated level of the reduction of the value of the signal-to-noise ratio.

After the automatic optimization of the first imaging parameters of the magnetic resonance sequence, an acquisition of magnetic resonance image data by the optimized magnetic resonance sequence takes place with the optimized imaging parameters. The automatic optimization of the imaging parameters may be implemented only when the user desires the optimization, for example by the user triggering the optimization by operation of an input unit.

By the automatic optimization of the imaging parameters, the user is relieved of confusing adaptations of the magnetic resonance sequences. Furthermore, a time savings is provided for the user because the user does not need to manually adapt the imaging parameters. The automatic optimization of the imaging parameters thus contributes to increased user comfort. Furthermore, due to the reduced noise volume of the magnetic resonance apparatus during the execution of the magnetic resonance sequence, the automatic optimization contributes to increased patient comfort and in particular increases the cooperation rate for noise-sensitive patients. The magnetic resonance examination can be implemented with less stress, and fewer interruptions of the examination occur. This produces a direct increase of the patient throughput through the magnetic resonance apparatus.

In an embodiment, the first imaging parameters produce to magnetic resonance images with a first contrast-to-noise ratio, and the optimized imaging parameters produce magnetic resonance images with a second contrast-to-noise ratio, wherein a value of the second contrast-to-noise ratio is reduced by at most 35 percent relative to a value of the first contrast-to-noise ratio. The value of the second contrast-to-noise ratio is preferably reduced by at most 25 percent—advantageously by at most 15 percent, most advantageously by at most 5 percent—relative to the value of the first contrast-to-noise ratio. The contrast-to-noise ratio represents an additional possible measure of the image quality. The value of the contrast-to-noise ratio is typically defined as the ratio of the intensity difference between the maximum and minimum power of a useful signal relative to the mean noise power of an interference signal. In addition to the signal-to-noise ratio, the contrast-to-noise ratio can serve as an advantageous condition that ensures that the image quality of the magnetic resonance images acquired by the optimized magnetic resonance sequence is largely maintained.

In a further embodiment, the first imaging parameters produce a first measurement duration of the magnetic resonance sequence and that the optimized imaging parameters produce a second measurement duration of the magnetic resonance sequence, wherein the second measurement duration is increased by a maximum of 30 percent relative to the first measurement duration. The second measurement duration is preferably increased by a maximum of 15 percent relative to the first measurement duration. The second measurement duration is advantageously increased by a maximum of 5 percent relative to the first measurement duration. A most, the second measurement duration is equal to the first measurement duration. The measurement duration is typically a measure that characterizes the time that passes between the start and the end of an acquisition of the magnetic resonance sequence. The measurement duration can thus serve as an additional condition for the optimization of the first imaging parameters, since a shortened measurement duration typically contributes to an increase of the patient comfort.

In another embodiment, the optimization of the first imaging parameters includes an avoidance of acoustic resonance frequencies of the magnetic resonance apparatus. The acoustic resonance frequencies of the of the magnetic resonance apparatus are typically those frequencies of a noise which induce an intensified co-oscillation of the magnetic resonance apparatus or of components of the magnetic resonance apparatus. The acoustic resonance frequencies can be specifically designed for different magnetic resonance apparatuses. For example, the acoustic resonance frequencies can depend on the length of the tunnel-shaped opening of the magnetic resonance apparatus. The avoidance of the acoustic resonance frequencies can lead to the situation that, during an acquisition of magnetic resonance images by the magnetic resonance sequence, the optimized imaging parameters cause a noise to be produced that is decoupled from the acoustic resonance frequencies of the magnetic resonance apparatus. For this purpose, the precise factor by which the first imaging parameters are adapted for optimization can be set during the optimization. This ensures that an increase of the noise volume level of the magnetic resonance apparatus during the acquisition of the magnetic resonance images due, to an unwanted interaction of the noises caused by the optimized magnetic resonance sequence and the acoustic resonance frequencies of the magnetic resonance apparatus, is avoided.

In a further embodiment, a simulation of the magnetic resonance sequence is implemented, and the avoidance of the acoustic resonance frequencies is implemented using the results of the simulation. The magnetic resonance sequence is preferably simulated with the optimized imaging parameters before it is used to acquire magnetic resonance images. If it is established in the simulation that the noises caused by the acquisition of the optimized magnetic resonance sequence interact with acoustic resonance frequencies of the magnetic resonance apparatus, the optimized imaging parameters of the magnetic resonance sequence can be optimized again in order to avoid the acoustic resonance frequencies of the magnetic resonance apparatus. The simulation offers an effective and safe possibility in order to ensure that the acoustic resonance frequencies of the magnetic resonance apparatus are avoided. A magnetic resonance sequence typically includes imaging frequencies and higher harmonics of the imaging frequencies. As an alternative or in addition to the simulation of the magnetic resonance sequence, an estimation and/or calculation of the dominating imaging frequencies and/or of the dominating higher harmonics can take place. The avoidance of the acoustic resonance frequencies can then include a use of the results of the estimation and/or calculation of the dominating imaging frequencies and/or of the dominating higher harmonics. The dominating imaging frequencies are those imaging frequencies that have the greatest associated oscillation intensity.

In another embodiment, the magnetic resonance apparatus has an input unit, and the optimization of the first imaging parameters is implemented by a user depending on one or more entries (inputs) made by the user via the input unit. For example, after selecting the magnetic resonance sequence the user can activate a selection field (a check box) via the input unit. The activation of the selection field will then typically lead to the situation that an automatic optimization of the first imaging parameters of the magnetic resonance sequence is implemented by means of a sequence optimization unit. The user thus has the possibility to decide when he or she desires an optimization of the first imaging parameters. This is typically the case when the user accepts a slight reduction of the image quality in order to enable a notable reduction of the noise volume of the magnetic resonance apparatus during the acquisition of magnetic resonance images by executing the optimized magnetic resonance sequence. For example, noise-sensitive patients can then be examined with the optimized magnetic resonance sequence. The changes to the magnetic resonance sequence that are caused by the optimization of the first imaging parameters can be proposed to the user for confirmation, such that the user can manually influence the optimized imaging parameters.

In a further embodiment, the optimization of the first imaging parameters includes a change of an echo time of the magnetic resonance sequence by at most 40 percent. The optimization of the first imaging parameters includes a change of the echo time of the magnetic resonance sequence, preferably by at most 30 percent, advantageously by at most 25 percent, at most advantageously by a maximum of 20 percent. The optimization of the first imaging parameters advantageously includes a change of the echo time of the magnetic resonance sequence by a minimum of 5 percent. Depending on the type of or adjustments to the magnetic resonance sequence, an increase or decrease of the echo time can be advantageous. As typically understood, the echo time is a measure that is double the time that passes between the excitation of a magnetization of nuclear spins in a measurement volume by excitation pulses, and a refocusing of the magnetization in the measurement volume by refocusing pulses.

In another embodiment, the optimization of the first imaging parameters includes an increase of an echo spacing of the magnetic resonance sequence by a maximum of 40 percent. The optimization of the first imaging parameters preferably includes an increase of the echo spacing of the magnetic resonance sequence by at most 30 percent, advantageously by a maximum of 25 percent, advantageously at most by a maximum of 20 percent. The optimization of the first imaging parameters advantageously includes an increase of the echo spacing of the magnetic resonance sequence by a minimum of 5 percent. As typically understood, the echo spacing characterizes a time that passes between the refocusing pulses of the magnetic resonance sequence.

In another embodiment, the optimization of the first imaging parameters includes an increase of a readout bandwidth of the magnetic resonance sequence by a maximum of 40 percent. The optimization of the first imaging parameters preferably includes an increase of the readout bandwidth of the magnetic resonance sequence by a maximum of 30 percent, advantageously by a maximum of 25 percent, at most advantageously by a maximum of 20 percent. The optimization of the first imaging parameters advantageously includes an increase of the readout bandwidth of the magnetic resonance sequence by a minimum of 5 percent. An increase of the readout bandwidth of the magnetic resonance sequence typically necessitates a shortening of the time in which the magnetic resonance signals are read out.

In another embodiment, the optimization of the first imaging parameters includes an increase of the pulse bandwidth of the magnetic resonance sequence by a maximum of 25 percent. The optimization of the first imaging parameters preferably includes an increase of the pulse bandwidth of the magnetic resonance sequence by a maximum of 20 percent, advantageously by a maximum of 15 percent, at most advantageously by a maximum of 10 percent. The optimization of the first imaging parameters advantageously includes an increase of the pulse bandwidth of the magnetic resonance sequence by a minimum of 5 percent. The pulse bandwidth of the radio-frequency pulses (in particular of the refocusing pulses) is typically increased. The duration of the radio-frequency pulses is therefore typically shortened. Furthermore, shorter radio-frequency pulses typically necessitate an increase of the strength of the radio-frequency pulses, and thus an increase of the specific absorption rate. The pulse bandwidth thus can also be increased to a maximum value, which is defined by the allowed specific absorption rate.

In another embodiment, the optimization of the first imaging parameters includes a selection of an asymmetric echo. The selection of an asymmetric echo can mean that the entirety of k-space is not filled with image data in the acquisition of the magnetic resonance images. This typically means that k-space is only partially filled with image data. A shorter time is then typically required for the readout of the magnetic resonance signals.

In another embodiment, the optimization of the first imaging parameters includes an extension of a repetition time of the magnetic resonance sequence by a maximum of 40 percent. The optimization of the first imaging parameters preferably includes an extension of the repetition time of the magnetic resonance sequence by a maximum of 30 percent, advantageously by a maximum of 25 percent, at most advantageously by a maximum of 20 percent. The optimization of the first imaging pars advantageously includes an extension of the repetition time of the magnetic resonance sequence by a minimum of 5 percent. As typically understood, the repetition time characterizes a time that passes between two excitation pulses of the magnetic resonance sequence.

The changes of the first imaging parameters within the optimization of the magnetic resonance sequence in accordance with the invention in particular include a change of an echo time of the magnetic resonance sequence; and/or an increase of an echo spacing of the magnetic resonance sequence; and/or an increase of a readout bandwidth of the magnetic resonance sequence; and/or an increase of a pulse bandwidth of the magnetic resonance sequence; apparatus a selection of an asymmetrical echo; and/or an extension of a repetition time of the magnetic resonance sequence. The proposed changes of the first imaging parameters thus occur between the first and optimized imaging parameters. The changes of the first imaging parameters can be implemented separately from one another. Multiple changes of the first imaging parameters can also be combined with one another in order to achieve an additional advantageous reduction of the noise volume of the magnetic resonance apparatus. The changes of the first imaging parameters can generally be implemented in arbitrary magnetic resonance sequences.

Specific optimizations are particularly advantageous depending on the type of the selected magnetic resonance sequence. In the case of a turbo spin echo sequence, it is particularly advantageous to increase the echo spacing, the echo time, the readout bandwidth and the pulse bandwidths. For a gradient echo sequence, it is particularly advantageous to increase the pulse bandwidths to a maximum value defined by the specific absorption rate, to select an asymmetrical echo, to increase the readout bandwidth and, particularly in susceptibility-weighted imaging, so as to increase the repetition time. The specific percentile values for the change of the first imaging parameters can also be dependent on the selected magnetic resonance sequence. For example, in a spin echo sequence a greater increase of the readout bandwidth than given a gradient echo sequence is typically advantageous.

The changes of the first imaging parameters of the magnetic resonance sequence can all enable advantageous gradient switchings during the implementation of the magnetic resonance sequence. The optimized imaging parameters thus can allow advantageous gradient switchings relative to the first imaging parameters. Gradient switchings are typically switchings of gradient coils of the magnetic resonance apparatus that lead to a change of the current flow through the gradient coils. Advantageous gradient switchings are typically gradient switchings that have flat slopes and/or have no discontinuous variations. Advantageous gradient switchings then lead to a reduced noise volume of the magnetic resonance apparatus during the acquisition of the magnetic resonance images.

The sequence optimization unit according to the invention for the optimization of a magnetic resonance sequence of a magnetic resonance apparatus has a computer that is designed to execute the method according to the invention as described above. The sequence optimization unit is thus designed to execute a method to optimize a magnetic resonance sequence of a magnetic resonance apparatus, wherein the magnetic resonance sequence includes first imaging parameters, and wherein, during acquisition of magnetic resonance images by the magnetic resonance sequence, the first imaging parameters produce a noise with a first noise volume level and magnetic resonance images with a first signal-to-noise ratio. The computer of the sequence optimization unit is designed to implement an automatic optimization of the first imaging parameters such that, during acquisition of magnetic resonance images by the magnetic resonance sequence, the optimized imaging parameters produce noise with a second noise volume level and magnetic resonance images with a second signal-to-noise ratio, wherein the second noise volume is reduced by at least 3 dB relative to the first noise volume, and a value of the second signal-to-noise ratio is reduced by a maximum of 35 percent relative to a value of the first signal-to-noise ratio. Embodiments of the sequence optimization unit according to the invention are designed analogously to the embodiments of the method according to the invention described above. By the automatic optimization of the imaging parameters, the sequence optimization unit can relieve a user of confusing modifications to magnetic resonance sequences. The sequence optimization unit thus contributes to increased user comfort. The optimization of the imaging parameters contributes to an increased patient comfort due to the reduced noise volume of the magnetic resonance apparatus, and in particular increases the cooperation rate given noise-sensitive patients. The sequence optimization unit can have additional control components that are necessary and/or advantageous for execution of a method according to the invention. The sequence optimization unit can also be designed to transmit control signals to the magnetic resonance apparatus and/or to receive and/or process control signals in order to execute a method according to the invention. Computer programs and additional software can be stored in a memory unit of a sequence optimization unit, by means of which computer programs and software a processor of the sequence optimization unit automatically controls and/or executes a method workflow of a method according to the invention.

The magnetic resonance apparatus according to the invention has a sequence optimization unit as described above. The magnetic resonance apparatus according to the invention is therefore designed to execute a method according to the invention with the sequence optimization unit. The sequence optimization unit can be integrated into the magnetic resonance apparatus. The sequence optimization unit can also be installed separately from the magnetic resonance apparatus. The sequence optimization unit can be connected with the magnetic resonance apparatus. By the automatic optimization of the imaging parameters, the magnetic resonance apparatus with the sequence optimization unit relieves a user of confusing adaptations of magnetic resonance sequences. The magnetic resonance apparatus with the sequence optimization unit thereby contributes to increased user comfort. Due to the reduced noise volume of the magnetic resonance apparatus, the automatic optimization of the imaging parameters contributes to an increased patient comfort and in particular increases the cooperation rate given noise-sensitive patients.

A non-transitory, computer-readable data storage medium product according to the invention can be loaded directly into a memory of a programmable computer of a magnetic resonance apparatus and has program code in order to execute this method according to the invention as described above when the program code is executed in the computer of the magnetic resonance apparatus. The method according to the invention can thus be executed so as to be identically repeatable and robust. The computer may have, for example, a working memory, a graphics card or a logic unit—so that the method steps can be executed efficiently. Examples of electronically readable data media are a DVD, a magnetic tape or a USB stick on which is stored electronically readable control information, in particular software (see above).

BRIEF DESCRIPTION OF THE DRAWINGS

FIG. 1 schematically illustrates a magnetic resonance apparatus according to the invention designed for execution of the method according to the invention.

FIG. 2 is a flowchart of an embodiment of the method according to the invention.

DESCRIPTION OF THE PREFERRED EMBODIMENTS

Figure 3:
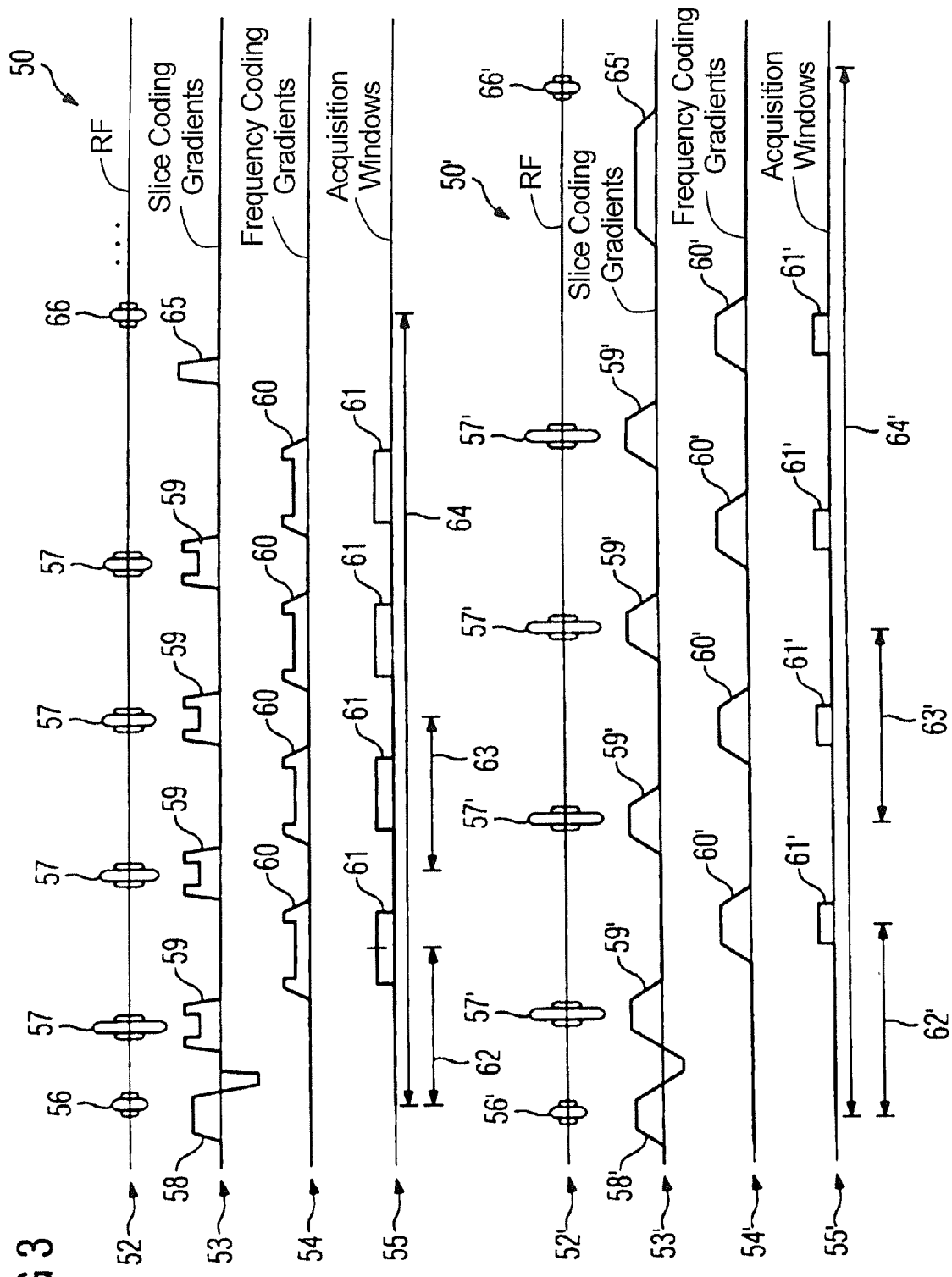
FIG. 3 shows a first sequence configuration of a first magnetic resonance sequence with first imaging parameters, and an optimized sequence configuration of an optimized magnetic resonance sequence with optimized imaging parameters.

FIG. 1 schematically depicts a magnetic resonance apparatus 11 according to the invention for the execution of the method according to the invention. The magnetic resonance apparatus 11 has a detector unit (scanner) formed by a magnet unit 13, with a basic magnet 17 to generate a strong and in particular constant basic magnetic field 18. The magnetic resonance apparatus 11 has a cylindrical patient accommodation region 14 to receive a patient 15, wherein the patient accommodation region 14 is cylindrically enclosed in a circumferential direction by the magnet unit 13. The patient 15 can be slid into the patient accommodation region 14 by a patient support device 16 of the magnetic resonance apparatus 11. For this purpose, the patient support device 16 has a table that is arranged so as to be movable within the magnetic resonance apparatus 11. The magnet unit 13 is externally shielded by a housing or casing 31 of the magnetic resonance apparatus 11.

The magnet unit 13 furthermore has a gradient coil unit 19 to generate magnetic field gradients that are used for spatially coding the magnetic resonance signals during an imaging. The gradient coil unit 19 is controlled by a gradient control unit 28. Furthermore, the magnet unit 13 has: a radio-frequency antenna unit 20 that, in the shown embodiment, is designed as a body coil permanently integrated into the magnetic resonance apparatus 11; and a radio-frequency (RF) antenna control unit 29 to excite a polarization that appears in the basic magnetic field 18 generated by the basic magnet 17. The radio-frequency antenna unit 20 is controlled by the radio-frequency antenna control unit 29 and radiates high-frequency radio-frequency pulses into the examination space that is essentially formed by the patient accommodation region 14.

The magnetic resonance apparatus 11 has a control unit 24 to control the basic magnet 17, the gradient control unit 28 and the radio-frequency antenna control unit 29. The control unit 24 centrally controls the magnetic resonance apparatus 11, for the implementation of magnetic resonance sequences. Control information (for example imaging parameters) as well as reconstructed magnetic resonance images can be displayed at a display unit 25 (for example on at least one monitor) of the magnetic resonance apparatus 11 for an operator. In addition to this, the magnetic resonance apparatus 11 has an input unit 26 via which information and/or imaging parameters can be entered as inputs by an operator during a measurement process. The control unit 24 can include the gradient control unit 28 and/or radio-frequency antenna control unit 29 and/or the display unit 25 and/or the input unit 26. First (unoptimized) imaging parameters of a magnetic resonance sequence can be passed directly from the control unit 24 to the gradient control unit 28 and the radio-frequency antenna control unit 29. In the gradient control unit 28 and radio-frequency antenna control unit 29, control commands are then generated from the first imaging parameters, and those control commands are used to control the gradient control unit 19 and the radio-frequency antenna unit 20. The magnetic resonance apparatus furthermore has a sequence optimization unit 30 which has a computer (not further shown) to optimize imaging parameters of magnetic resonance sequences.

The shown magnetic resonance apparatus 11 can naturally include additional components that magnetic resonance apparatuses 11 conventionally have. The general functioning of a magnetic resonance apparatus 11 is known to those skilled in the art, such that a more detailed description of the additional components is not necessary herein.

FIG. 2 is a flowchart of an embodiment of the method according to the invention. In a first method step 40, a patient 15 is positioned on the patient support device 16 in the patient accommodation region 14 of the magnetic resonance apparatus 11 to acquire magnetic resonance images. In a further method step 41, a user selects a magnetic resonance sequence with first imaging parameters by means of the input unit 26. For an acquisition of magnetic resonance images by operation of the magnetic resonance sequence, the first imaging parameters would lead to a noise with a first noise volume and to magnetic resonance images with a first signal-to-noise ratio.

In a further method step 42, an automatic optimization of the imaging parameters is implemented by means of the sequence optimization unit 30, wherein optimized imaging parameters are generated. For this purpose, the first imaging parameters of the magnetic resonance sequence are initially passed from the control unit 24 to the sequence optimization unit 30. The sequence optimization unit 30 optimizes the first imaging parameters automatically and thereby generates optimized imaging parameters.

In the optimization of the first imaging parameters, the sequence optimization unit 30 can implement a change of an echo time of the magnetic resonance sequence by a maximum of 40 percent, preferably by a maximum of 30 percent, advantageously by a maximum of 25 percent, advantageously at most by a maximum of 20 percent.

Furthermore, with the optimization of the first imaging parameters, the sequence optimization unit 30 can implement an increase of an echo spacing of the magnetic resonance sequence by a maximum of 40 percent, preferably by a maximum of 30 percent, advantageously by a maximum of 25 percent, at most advantageously by a maximum of 20 percent.

Furthermore, with the optimization of the first imaging parameters, the sequence optimization unit 30 can implement an increase of a readout bandwidth of the magnetic resonance sequence by a maximum of 40 percent, preferably by a maximum of 30 percent, advantageously by a maximum of 25 percent, at most advantageously by a maximum of 20 percent.

Furthermore, with the optimization of the first imaging parameters, the sequence optimization unit 30 can implement an increase of a pulse bandwidth of the magnetic resonance sequence by a maximum of 25 percent, preferably by a maximum of 20 percent, advantageously by a maximum of 15 percent, at most advantageously by a maximum of 10 percent.

Furthermore, with the optimization of the first imaging parameters the sequence optimization unit 30 can implement a selection of an asymmetrical echo.

Furthermore, with the optimization of the first imaging parameters, the sequence optimization unit 30 can implement an extension of a repetition time of the magnetic resonance sequence by a maximum of 40 percent, preferably by a maximum of 30 percent, advantageously by a maximum of 25 percent, at most advantageously by a maximum of 20 percent.

The following combinations of optimizations of the first imaging parameters can be implemented by means of the sequence optimization unit 30: a change of an echo time of the magnetic resonance sequence by one of the indicated levels; and/or an increase of an echo spacing of the magnetic resonance sequence by one of the indicated levels; and/or an increase of a readout bandwidth of the magnetic resonance sequence by one of the indicated levels; and/or an increase of a pulse bandwidth of the magnetic resonance sequence by one of the indicated levels; and/or a selection of an asymmetrical echo; and/or an extension of a repetition time of the magnetic resonance sequence by one of the indicated levels.

In a further method step 43, the optimized imaging parameters are possibly optimized again by means of the sequence optimization unit 30 in order to avoid acoustic resonance frequencies of the magnetic resonance apparatus. For this purpose, a simulation of the magnetic resonance sequence is implemented, wherein the avoidance of the acoustic resonance frequencies includes a use of the results of the simulation. In an alternative embodiment of the method, the further method step 43 can be omitted.

In a further method step 44, the optimized imaging parameters are passed from the sequence optimization unit to the gradient control unit 28 and the radio-frequency antenna control unit 29. The gradient control unit 28 and the radio-frequency antenna control unit 29 then generate optimized control commands from the optimized imaging parameters, which optimized control commands are then used to control the fc unit 19 and the radio-frequency antenna unit 20.

Finally, in a further method step 45 the optimized magnetic resonance sequence with the optimized control commands is executed to acquire magnetic resonance images by the magnetic resonance apparatus 11. During the acquisition of the magnetic resonance images by means of the optimized magnetic resonance sequence, the optimized imaging parameters produce a noise with a second noise volume level and to magnetic resonance images with a second signal-to-noise ratio, wherein the second noise volume level is reduced by at least 3 dB relative to the first noise volume level and a value of the second signal-to-noise ratio is reduced by a maximum of 35 percent relative to a value of the first signal-to-noise ratio.

The method steps of the method according to the invention that are shown in FIG. 2 are executed by the sequence optimization unit 30 together with the magnetic resonance apparatus 11. For this purpose, the sequence optimization unit 30 has required software and/or computer programs that are stored in a memory unit of the sequence optimization unit 30. The software and/or computer programs include program means that are designed to execute the method according to the invention if the computer program and/or the software are executed in the sequence optimization unit 30 by a processor unit of the magnetic resonance apparatus 11.

FIG. 3 shows a first sequence configuration 50 of a first magnetic resonance sequence with first imaging parameters and an optimized sequence scheme 50' of an optimized magnetic resonance sequence with optimized imaging parameters. The first imaging parameters have been optimized by means of an embodiment of a method according to the invention for generation of the optimized imaging parameters. The first sequence scheme 50 and the optimized sequence scheme 50' are each a turbo spin echo sequence with four echoes. The optimization of the imaging parameters is naturally not limited to the optimization of a turbo spin echo sequence. Arbitrary types of magnetic resonance sequences can be optimized by the method according to the invention.

Each sequence configuration 50, 50' includes four axes 52, 53, 54, 55, 52', 53', 54', 55' on which are plotted different types of control commands in their chronological order. Naturally, the sequence schematics 50, 50' can have control commands and/or additional types of control commands which here are not shown for the sake of better clarity. The radio-frequency pulses are respectively plotted on the first axis 52, 52'. The slice coding gradients—which enable a spatial coding of the magnetic resonance signals in a spatial direction which corresponds to the direction of the variation of the slices of the magnetic resonance images—are respectively plotted on the second axis 53, 53'. The frequency coding gradients—which enable a spatial coding of the magnetic resonance signals in a spatial direction which corresponds to the direction of the variations of the frequencies of the magnetic resonance signal—are respectively plotted on the third axis 54, 54'. The acquisition windows—which indicate those time periods in which the magnetic resonance signals are acquired—are respectively plotted on the fourth axis 55, 55'.

The shown sequence schematics 50, 50' of turbo spin echo sequences respectively start with an excitation pulse 56, 56'. A respective excitation gradient shape 58, 58' is respectively switched during the excitation pulse 56, 56'. The turbo spin echo sequences are shown as examples with four echoes. However, an arbitrary number of echoes can exist for the turbo spin echo sequences. For each echo, a refocusing pulse 57, 57' is applied during which a respective refocusing gradient shape 59, 59' is switched. After each refocusing pulse 57, 57', a respective activated acquisition window 61, 61' exists during which an acquisition gradient form 60, 60' is switched.

Only one acquisition cycle of the turbo spin echo sequence and the first radio-frequency pulse of a next acquisition cycle of the turbo spin echo sequence is thereby shown in FIG. 3. The next acquisition cycle respectively starts again with an excitation pulse 66, 66'. Another spoiler gradient 65, 65', which dephases a transversal magnetization is switched before the next acquisition cycle.

The time between the excitation pulse 56, 56' and the middle of the activated acquisition window 61, 61' is called echo time 62, 62'. The time between two refocusing pulses 57, 57' is called echo interval 63, 63'. The time between the excitation pulse 56, 56' of the first acquisition cycle and the excitation pulse 66, 66' of the next acquisition cycle is called the repetition time 64, 64'.

The first sequence scheme 50 thereby shows the control commands which have been generated in an additional method step 41 (FIG. 2) from the selected magnetic resonance sequence with the first imaging parameters. The optimized sequence scheme 50' thereby shows the optimized control commands which, in the further method step 44, have been generated from the optimized imaging parameters by the gradient control unit 28 and the radio-frequency antenna control unit 29, wherein the optimized imaging parameters have been generated in the additional method steps 42, 43.

In the optimized sequence scheme 50' of the turbo spin echo sequence, the pulse bandwidths of the optimized refocusing pulses 57' are increased relative to the pulse bandwidths of the first refocusing pulses 57 of the first sequence scheme 50. This leads to the optimized refocusing pulses 57' being shortened relative to the first refocusing pulses 57 and have a higher amplitude. This leads to the optimized refocusing gradient shapes 59' likewise being shortened relative to the first refocusing gradient shapes 59 and have an increased amplitude. This leads to the situation that the optimized refocusing gradient shapes 59' can be advantageously designed. The first refocusing gradient shapes 59 respectively have another two crusher (spoiler) gradients at the beginning and at the end of each first refocusing gradient shape 59 the spoiler gradients are discontinuous changes of the slice coding gradient switchings and represent correction gradients. Due to the increase of the pulse bandwidth of the optimized refocusing pulses 57', the spoiler gradients are not necessary for the optimized refocusing gradient shapes 59'. The noise volume level during the acquisition of the optimized sequence configuration 50' of the turbo spin echo sequence is therefore reduced relative to the acquisition of the first sequence scheme 50 since the crusher gradients lead to a high noise volume due to the discontinuous changes of the gradient switchings.

The readout bandwidth of the optimized sequence scheme 50' of the turbo spin echo sequence is similarly increased relative to the readout bandwidth of the first sequence scheme 50. This leads to the situation that the optimized, activated acquisition window 61' are shortened relative to the first activated acquisition windows 61. This again leads to the situation that, in the optimized acquisition gradient shapes 60', no loud spoiler gradients are necessary relative to the first acquisition gradient shapes 60.

Furthermore, the optimized echo time 62' is increased relative to the first echo time 62. This leads to the situation that a longer time elapses between the optimized refocusing pulses 57' and the optimized excitation pulse 56' than between the first refocusing pulses 57 and the first excitation pulse 56. This leads to the situation that more time is provided for the optimized excitation gradient shape 58' than for the first excitation gradient shape 58. The optimized excitation gradient shape 58' can therefore be designed to be flatter than the first excitation gradient shape 58'. The optimized excitation gradient shape 58' also has flatter slopes than the first excitation gradient shape 58. This again leads to a reduced noise volume level of the magnetic resonance apparatus 11 during the application of the optimized excitation gradient shape 58'. The integral over the first excitation gradient shape 58' is identical to the integral over the optimized excitation gradient shape 58.

The optimized echo spacing 63' is also similarly increased relative to the first echo spacing 63. This leads to the situation that the gradient switchings are of flatter design and have flatter slopes, such that the noise volume of the magnetic resonance apparatus 11 is reduced relative to the gradient switchings.

Finally, the optimized repetition time 64' is further increased relative to the first repetition time 64. This leads to the situation that more time is provided for the optimized spoiler gradient 65' relative to the first spoiler gradient 65. The optimized spoiler gradient 65' can therefore be of flatter design than the first spoiler gradient 65. Furthermore, the optimized spoiler gradient 65' has flatter slopes than the first spoiler gradient 65. This again has a reduced noise volume level of the magnetic resonance apparatus 11 during the application of the optimized spoiler gradient 65'.

Naturally, only examples of possible optimizations of a magnetic resonance sequence are shown in. FIG. 3. Yet another selection (not shown) of an asymmetrical echo would be conceivable which enables additional advantageous gradient switchings. Naturally, not all shown optimizations need to be implemented simultaneously to generate the optimized sequence scheme 50' from the first sequence scheme 50. However, it can be advantageous to simultaneously execute at least a portion of the shown optimizations, for example to simultaneously increase the echo time and the echo spacing. The reduction of the noise volume level is then advantageously increased by the simultaneous different optimizations.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to optimize a magnetic resonance sequence for operating a magnetic resonance apparatus, comprising:
   providing a computerized processor with a magnetic resonance sequence that includes first imaging parameters, said magnetic resonance sequence with said first imaging parameters, when executed by a magnetic resonance apparatus to acquire magnetic resonance data from a subject, from which magnetic resonance images are reconstructed, producing acoustic noise at a first acoustic noise volume level and magnetic resonance images with image noise at a first signal-to-image noise ratio;
   in said computerized processor, executing an optimization algorithm that automatically optimizes at least said first imaging parameters in said magnetic resonance sequence to produce an optimized magnetic resonance sequence that, when executed by said magnetic resonance apparatus, produces acoustic noise at a second acoustic noise volume level that is reduced by at least 3 dB relative to said first acoustic noise volume level, and magnetic resonance images with image noise at a second signal-to-image noise ratio that is reduced by a maximum of 35% relative to said first signal-to-image noise ratio; and
   making the optimized magnetic resonance sequence available in electronic form at an output of said processor in a format for execution of said optimized magnetic resonance sequence by said magnetic resonance apparatus.

2. A method as claimed in claim 1 wherein said magnetic resonance sequence with said first imaging parameters produces magnetic resonance images with a first contrast-to-image noise ratio, and comprising, in said computerized processor, executing said optimization algorithm to optimize at least said first imaging parameters to produce, when said optimized magnetic resonance sequence is executed by said magnetic resonance apparatus, magnetic resonance images with a second contrast-to-noise ratio that is reduced by a maximum of 35% relative to said first contrast-to-image noise ratio.

3. A method as claimed in claim 1 wherein said magnetic resonance sequence with said first imaging parameters produces magnetic resonance images with a first measurement duration, and comprising, in said computerized processor, executing said optimization algorithm to optimize at least said first imaging parameters to produce, when said optimized magnetic resonance sequence is executed by said magnetic resonance apparatus, magnetic resonance images with a second measurement duration that is increased by a maximum of 30% relative to said first measurement duration.

4. A method as claimed in claim 1 comprising, in said computerized processor, executing said optimization algorithm to avoid occurrence of acoustic resonance frequencies of said magnetic resonance apparatus, when said optimized magnetic resonance sequence is executed by said magnetic resonance apparatus.

5. A method as claimed in claim 4 comprising avoiding said occurrence of said acoustic resonance frequencies by simulating, in said optimization algorithm, operation of the magnetic resonance apparatus according to the optimized magnetic resonance sequence, and thereby obtaining simulation results, and using said simulation results to avoid said occurrence of said acoustic resonance frequencies.

6. A method as claimed in claim 1 comprising executing said optimization algorithm dependent on at least one manual input entered into said computerized processor via an input unit of said computerized processor.

7. A method as claimed in claim 1 wherein said magnetic resonance sequence with said first imaging parameters exhibits an echo time, and comprising, in said computerized processor, executing said optimization algorithm to change said echo time in the optimized magnetic resonance sequence by a maximum of 40% relative to the echo time of said magnetic resonance sequence with said first imaging parameters.

8. A method as claimed in claim 1 wherein said magnetic resonance sequence with said first imaging parameters exhibits an echo spacing, and comprising, in said computerized processor, executing said optimization algorithm to increase said echo spacing in the optimized magnetic resonance sequence by a maximum of 40% relative to the echo spacing of said magnetic resonance sequence with said first imaging parameters.

9. A method as claimed in claim 1 wherein said magnetic resonance sequence with said first imaging parameters exhibits an readout bandwidth, and comprising, in said computerized processor, executing said optimization algorithm to increase said readout bandwidth in the optimized magnetic resonance sequence by a maximum of 40% relative to the readout bandwidth of said magnetic resonance sequence with said first imaging parameters.

10. A method as claimed in claim 1 wherein said magnetic resonance sequence with said first imaging parameters exhibits an pulse bandwidth, and comprising, in said computerized processor, executing said optimization algorithm to increase said pulse bandwidth in the optimized magnetic resonance sequence by a maximum of 25% relative to the pulse bandwidth of said magnetic resonance sequence with said first imaging parameters.

11. A method as claimed in claim 1 comprising, in said control computer, executing said optimization algorithm with a selection of an asymmetrical echo in said optimized magnetic resonance sequence.

12. A method as claimed in claim 1 wherein said magnetic resonance sequence with said first imaging parameters exhibits a repetition time, and comprising, in said computerized processor, executing said optimization algorithm to extend said repetition time in the optimized magnetic resonance sequence by a maximum of 40% relative to the repetition time of said magnetic resonance sequence with said first imaging parameters.

13. A sequence optimization unit that optimizes a magnetic resonance sequence for operation of a magnetic resonance apparatus, said sequence optimization unit comprising:
- a computerized processor provided with a magnetic resonance sequence that includes first imaging parameters, said magnetic resonance sequence with said first imaging parameters, when executed by a magnetic resonance apparatus to acquire magnetic resonance data from a subject, from which magnetic resonance images are reconstructed, produce acoustic noise at a first acoustic noise volume level and magnetic resonance images with image noise at a first signal-to-image noise ratio;
- said computerized processor being configured to execute an optimization algorithm that automatically optimizes at least said first imaging parameters in said magnetic resonance sequence to produce an optimized magnetic resonance sequence that, when executed by said magnetic resonance apparatus, produces acoustic noise at a second acoustic noise volume level that is reduced by at least 3 dB relative to said first acoustic noise volume level, and magnetic resonance images with image noise at a second signal-to-image noise ratio that is reduced by a maximum of 35% relative to said first signal-to-image noise ratio; and
- said computerized processor being configured to make the optimized magnetic resonance sequence available in electronic form at an output of said processor in a format for execution of said optimized magnetic resonance sequence by said magnetic resonance apparatus.

14. A magnetic resonance apparatus comprising:
a magnetic resonance data acquisition unit;
a computerized processor provided with a magnetic resonance sequence that includes first imaging parameters, said magnetic resonance sequence with said first imaging parameters, when executed by said magnetic resonance data acquisition unit to acquire magnetic resonance data from a subject, from which magnetic resonance images are reconstructed, producing acoustic noise at a first acoustic noise volume level and magnetic resonance images with image noise at a first signal-to-image noise ratio;
said computerized processor being configured to execute an optimization algorithm that automatically optimizes at least said first imaging parameters in said magnetic resonance sequence to produce an optimized magnetic resonance sequence that, when executed by said magnetic resonance data acquisition unit, produces acoustic noise at a second acoustic noise volume level that is reduced by at least 3 dB relative to said first acoustic noise volume level, and magnetic resonance images with image noise at a second signal-to-image noise ratio that is reduced by a maximum of 35% relative to said first signal-to-image noise ratio; and
said computerized processor being configured to make the optimized magnetic resonance sequence available in electronic form at an output of said processor in a format for execution of said optimized magnetic resonance sequence by said magnetic resonance apparatus.

15. A non-transitory, computer-readable data storage medium encoded with programming instructions, said storage medium being loaded into a control computer of a magnetic resonance apparatus and said programming instructions causing said control computer to:
receive or access a magnetic resonance sequence that includes first imaging parameters, said magnetic resonance sequence with said first imaging parameters, when executed by a magnetic resonance apparatus to acquire magnetic resonance data from a subject, from which magnetic resonance images are reconstructed, producing acoustic noise at a first noise volume level and magnetic resonance images with image noise at a first signal-to-image noise ratio;
execute an optimization algorithm that automatically optimizes at least said first imaging parameters in said magnetic resonance sequence to produce an optimized magnetic resonance sequence that, when executed by said magnetic resonance apparatus, produces acoustic noise at a second acoustic noise volume level that is reduced by at least 3 dB relative to said first acoustic noise volume level, and magnetic resonance images with image noise at a second signal-to-image noise ratio that is reduced by a maximum of 35% relative to said first signal-to-image noise ratio; and
make the optimized magnetic resonance sequence available in electronic form at an output of said processor in a format for execution of said optimized magnetic resonance sequence by said magnetic resonance apparatus.

* * * * *